US007006637B1

(12) United States Patent
Konetski et al.

(10) Patent No.: US 7,006,637 B1
(45) Date of Patent: Feb. 28, 2006

(54) INTEGRATED SELF DIAGNOSTICS FOR LOUDSPEAKER SYSTEMS

(75) Inventors: David Konetski, Austin, TX (US); Joe Curley, Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/360,060

(22) Filed: Jul. 23, 1999

(51) Int. Cl.
*H03G 11/00* (2006.01)
*H04R 29/00* (2006.01)

(52) U.S. Cl. .......................... 381/55; 381/59; 381/189

(58) Field of Classification Search .................. 381/55, 381/56, 58, 59, 96, 189
See application file for complete search history.

(56) References Cited

U.S. PATENT DOCUMENTS 3,959,735 A * 5/1976 GrosJean ................ 330/207 P
4,163,119 A * 7/1979 Baba et al. .................... 381/55
4,296,278 A * 10/1981 Cullison et al. .............. 381/55
4,301,330 A * 11/1981 Trump .......................... 381/55
4,887,298 A * 12/1989 Haigler ......................... 381/55
5,361,305 A 11/1994 Easley et al. .................. 381/58
5,451,924 A 9/1995 Massimino et al. ...... 340/407.1
5,644,505 A * 7/1997 Soutar et al. ................. 381/58
5,847,610 A * 12/1998 Fujita ......................... 330/298
5,852,545 A 12/1998 Pan-Ratzlaff ............... 361/683
5,915,029 A * 6/1999 Yazurlo et al. ............... 381/58
6,111,957 A * 8/2000 Thomasson .................. 381/15

* cited by examiner

*Primary Examiner*—Xu Mei
(74) *Attorney, Agent, or Firm*—Haynes and Boone, LLP

(57) ABSTRACT

A self-diagnostic circuit for speaker systems that allows a speaker system to generate its own test signals, e.g., tones, appropriate for the transducer(s) in the speaker system. The test signals are routed to the analog circuits in the speaker system. The test signals are also routed to the transducers, so that an operator can evaluate speaker output tones. In one embodiment, the test signals are also routed to an analog activity sensor that senses activity in the speaker analog circuit paths and sends a status indicator to be displayed to the operator. In a first embodiment, the self-diagnostic circuit is a part of a stand-alone speaker system, such as a home theater sound system. In a second embodiment, the self-diagnostic circuit is included in a speaker system that is included in a computer system.

14 Claims, 4 Drawing Sheets

INTEGRATED SELF DIAGNOSTICS FOR LOUDSPEAKER SYSTEMS

BACKGROUND

This disclosure relates to audio speakers, and more particularly to a system for performing self-diagnostics on audio speaker systems.

Computer systems in general and personal computer systems in particular have attained widespread use for providing computer power to many segments of today's modern society. A personal computer system can usually be defined as a desktop, floor standing, or portable microcomputer that includes a system unit having a system processor and associated volatile and non-volatile memory, a display monitor, a keyboard, one or more diskette drives, a fixed disk storage device and an optional printer. One of the distinguishing characteristics of these systems is the use of a system board to electrically connect these components together. These personal computer systems are information handling systems which are designed primarily to give independent computing power to a single user (or a relatively small group of users in the case of personal computers which serve as computer server systems) and are inexpensively priced for purchase by individuals or small businesses. A personal computer system may also include one or a plurality of I/O devices (i.e. peripheral devices) which are coupled to the system processor and which perform specialized functions. Examples of I/O devices include modems, sound and video devices or specialized communication devices. Mass storage devices such as hard disks, CD-ROM drives and magneto-optical drives are also considered to be peripheral devices. Computers producing multimedia effects (e.g., sound coupled with visual images) are in increased demand as computers are used for artistic endeavors, for entertainment, and for education. The use of sound makes game playing more realistic and helps reinforce knowledge and make educational programs more enjoyable to use. Digital effects and music can also be created on the computer and played through attached speakers without the need for additional musical instruments or components.

Multimedia systems today often include audio devices (e.g., sound cards) connected to the computer to which speaker systems can be attached for playing music and other sound effects. The speaker systems include analog circuitry, such as, for example, volume controllers, tone processors, equalizers, and attenuators. Even speaker systems with high digital computing content nonetheless include a large component of analog circuitry.

Testing and diagnosis of these analog portions of a speaker system pose challenges to modern computer manufacturing and repair facilities, and to field diagnostics personnel. In prior art speaker systems, if the system fails to operate in an application, the operator can only manipulate the inputs to the speaker (i.e., signal, power, and controls) in order to determine whether the speaker system is functioning correctly. It is known in the art to test the operability of analog components of the speaker system by invoking a test procedure that plays music or a test pattern on the speakers. An operator, usually a user or technician, listens to the resulting output of the speakers to determine whether the test passes or fails.

A challenge of testing and diagnosing speaker systems by listening to the result in a manufacturing or test facility arises because the test area is often noisy, which renders it difficult to distinguish one system being tested from another. In addition, to thoroughly test a speaker system, the operator must listen to a variety of sounds to ensure that the system is working properly. This approach is time-consuming and can adversely affect the throughput of the manufacturing facility. Finally, human error, which may be caused by repetitively listening to numerous systems, may cause the technician to pass an audio device which would otherwise fail. Similarly, human error is also a challenge for field diagnostics personnel, such as tech support providers. In such situations, a user may not fully understand the installation and testing procedures for a speaker subsystem, and therefore may impart erroneous information to the tech support provider.

An improvement to the testing and diagnosis of audio speaker systems is needed which alleviates the burden on users or technicians who manually listen to sounds. What is desired is a manner of, in addition to listening to sounds, obtaining reliable, easy-to-interpret results from the testing of the internal circuitry of the speaker system.

SUMMARY

The present disclosure relates to a self-diagnostic circuit for speaker systems that allows a speaker system to generate its own test signals, e.g., tones, appropriate for the transducer(s) in the speaker system. The test signals are routed to the analog circuits in the speaker system. The test signals are also routed to the transducers, so that an operator can evaluate speaker output tones. In one embodiment, the test signals are also routed to an analog activity sensor that senses activity in the speaker analog circuit paths and sends a status indicator to be displayed to the operator. In a first embodiment, the self-diagnostic circuit is part of a stand-alone speaker system, such as a home theater sound system. In a second embodiment, the self-diagnostic circuit is included in a speaker system that is included in a computer system.

In both the stand-alone and computer system embodiments, the speaker system includes at least one transducer, at least one speaker analog circuit, and a diagnostics circuit coupled to them both. The diagnostics circuit includes a power diagnostics circuit and an analog diagnostics circuit. In this manner, the integrated diagnostics of the speaker system tests both the analog circuits and the power circuit.

Regarding the power diagnostics circuit, one embodiment includes at least one AC power test indicator that indicates whether the speaker system is receiving AC power from the rectifier in the power circuit. The AC power test indicator is coupled to the rectifier. In a second embodiment, the power diagnostics circuit includes at least one DC power test indicator that indicates whether the speaker system is receiving DC power from the AC-to-DC conversion circuit in the power circuit. The DC power test indicator is coupled to the AC to DC conversion circuit. An alternative embodiment may include both the AC and DC power test indicators.

Regarding analog diagnostics, the analog diagnostics circuit includes a diagnostic mode activation mechanism, such as a switch or button. The activation mechanism is coupled to a diagnostic signal generation circuit, and indicates to the signal generation circuit that an operator is requesting that diagnostics be run. In response, the diagnostic signal generation circuit generates at least one test signal. Each test signal is routed to one or more of the speaker analog circuits, and to at least one transducer. The diagnostic signal generation circuit is therefore coupled to at least one of the speaker analog circuits and to at least one transducer. Each speaker analog circuit receives at least one test signal, as does each transducer. In this basic embodiment, an operator gets an overall indication of system operability by noting whether or not the sound of the test signal emanates from the transducers.

In a second embodiment of the analog diagnostics circuit, the operator gets a more specific indication of speaker system functionality. In this second embodiment, an analog activity sensor samples the output of each speaker analog circuit to determine whether the test tones are being passed through the analog circuit. In one embodiment, the analog activity sensor is made of at least one transistor; in a second embodiment it is made of at least one comparator. In the preferred embodiment, the test signals are sampled by the analog activity sensor both before and after being routed to each speaker analog circuit in their test path. In an alternative embodiment, the test signals are routed to the analog activity sensor only after being routed to each speaker analog circuit in their test path. The analog activity sensor generates a status indicator for each speaker analog circuit sampled. Each status indicator is routed to an analog test indicator (which is coupled to the analog activity sensor) so that the operator gets a visual indication of functionality for each speaker analog circuit. In an alternative embodiment, a less specific description of system operability may be obtained by routing more than one status indicator to a single analog test indicator.

The computer system embodiment of the present disclosure includes the speaker system described above, as well as a processor and memory, where the speaker system and memory are both coupled to the processor.

BRIEF DESCRIPTION OF THE DRAWINGS

The present disclosure may be better understood, and its numerous objects, features, and advantages made apparent to those skilled in the art, by referencing the accompanying drawings.

The use of the same reference symbols in different drawings indicates similar or identical items.

DESCRIPTION OF THE PREFERRED EMBODIMENT(S)

The following sets forth a detailed description of a mode for carrying out the embodiments. The description is intended to be illustrative of the embodiments and should not be take to be limiting.

Figure 1:
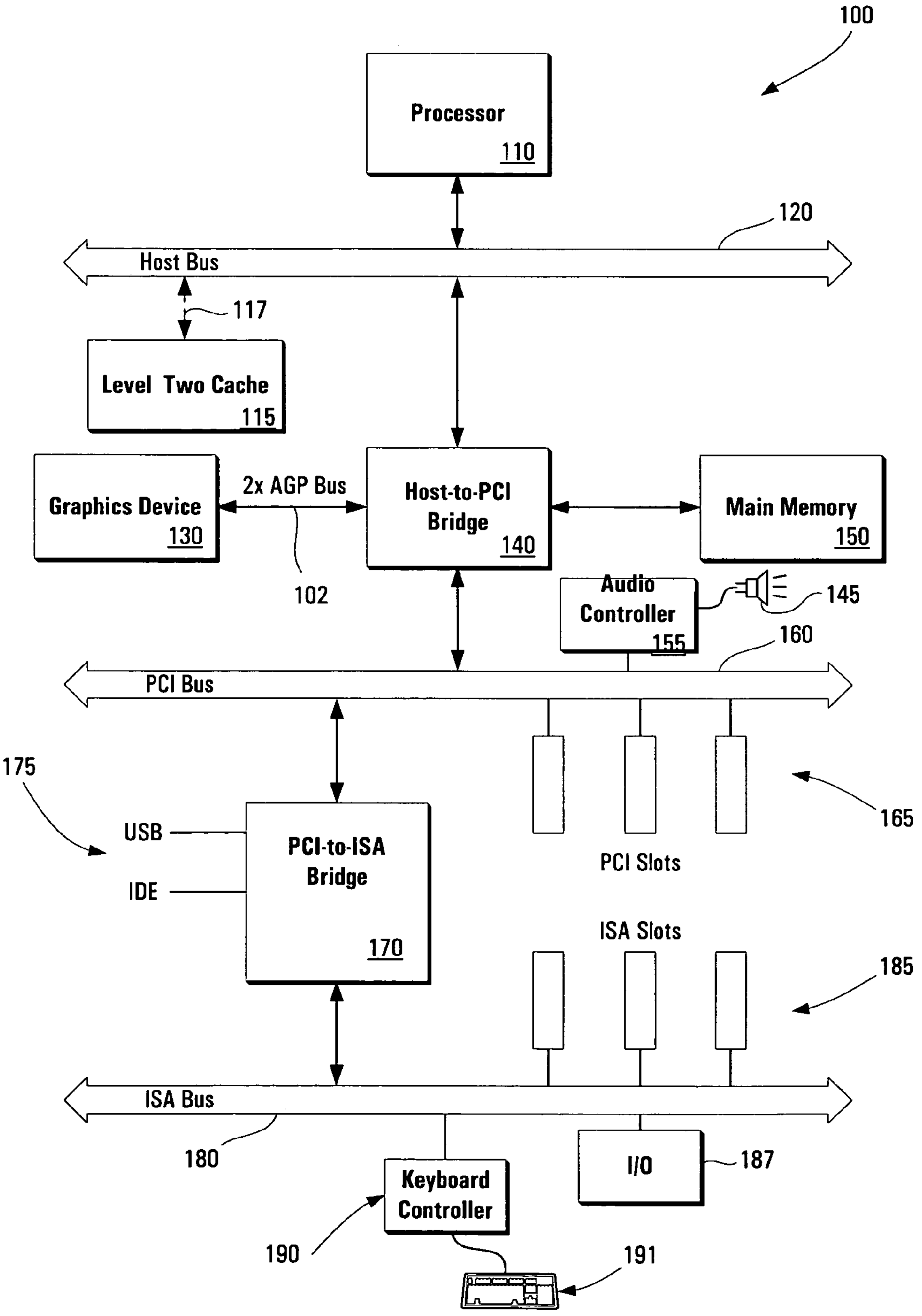
FIG. 1 is a block diagram of a computer system that includes a speaker system.

FIG. 1 is a block diagram of an exemplary computer system 100 that includes a speaker system 145. The computer system 100 may be found in many forms including, for example, mainframes, minicomputers, workstations, servers, personal computers, internet terminals, notebooks and embedded systems. Personal computer (PC) systems, such as those compatible with the x86 configuration, include desktop, floor standing, or portable versions. A typical PC computer system 100 is a microcomputer that includes a microprocessor (or simply "processor") 110, associated memory 150 and control logic and a number of peripheral devices 130, 187, 191, 145 that provide input and output for the system 100. A typical computer system 100 may also include a cache 115 to facilitate quicker access between the processor 110 and main memory 150. The peripheral devices often include speaker systems 145, keyboards 191, graphics devices 130, and traditional I/O devices 187 that often include display monitors, mouse-type input devices, floppy and hard disk drives, CD-ROM drives and printers. The number of devices being added to personal computer systems continues to grow. For example, many computer systems also include network capability, terminal devices, modems, televisions, sound devices, voice recognition devices, electronic pen devices, and mass storage devices such as tape drives, CD-R drives or DVDs. The peripheral devices usually communicate with the processor over one or more buses 120, 160, 180, with the buses communicating with each other through the use of one or more bridges 140, 170.

Figure 2:
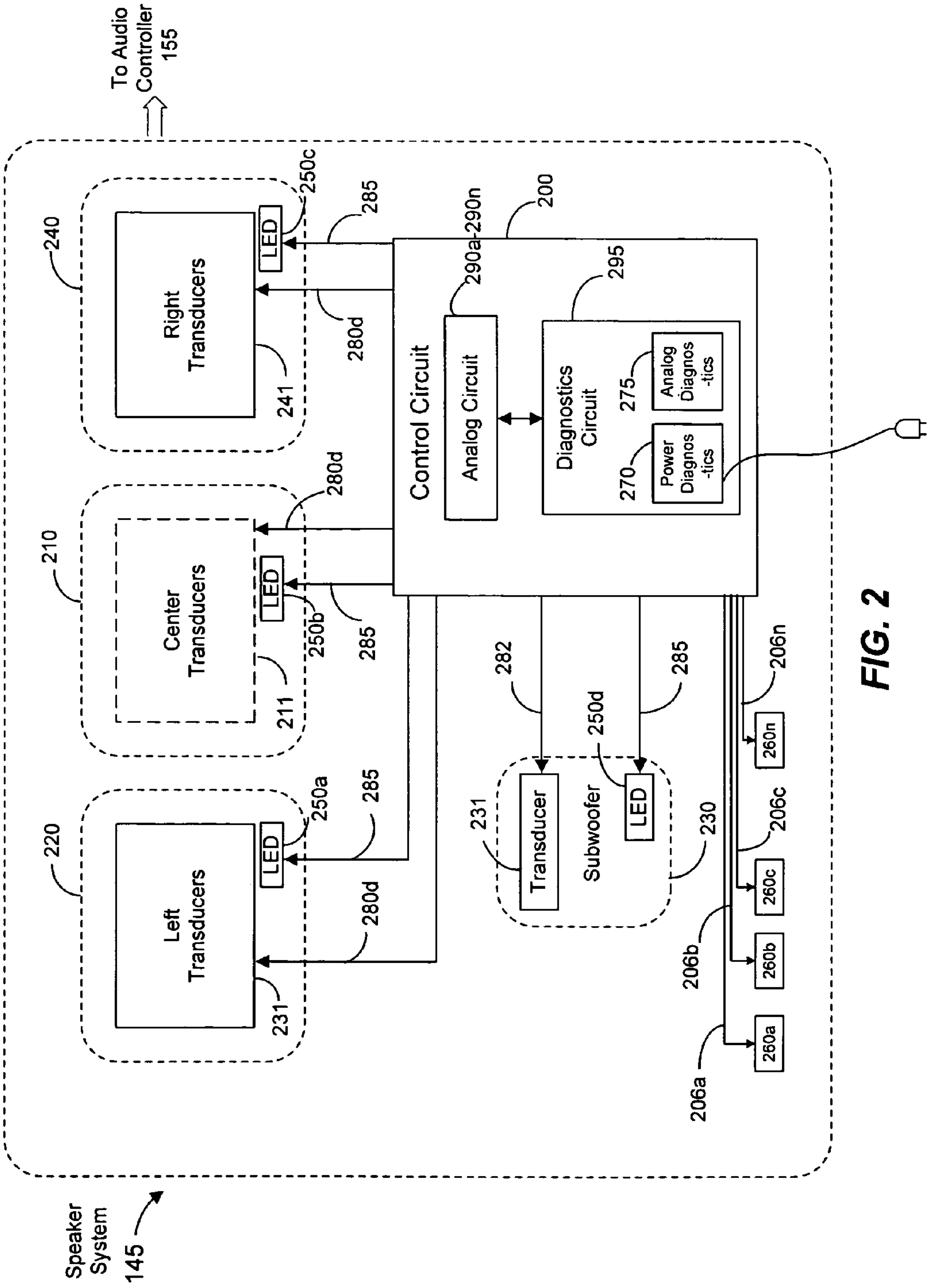
FIG. 2 is a block diagram of an exemplary speaker system embodying the integrated diagnostics of the present disclosure.

One skilled in the art will recognize that the foregoing components and devices are used as examples for sake of conceptual clarity and that various configuration modifications are common. For example, the audio controller 155 is connected to the PCI bus 160 in FIG. 1, but may be connected to the ISA bus 180 or other appropriate I/O buses in alternative embodiments. As further example, processor 110 is used as an exemplar of any general processing unit, including but not limited to multiprocessor units; host bus 120 is used as an exemplar of any processing bus, including but not limited to multiprocessor buses; PCI bus 160 is used as an exemplar of any input-output devices attached to any I/O bus; AGP bus 102 is used as an exemplar of any graphics bus; graphics device 130 is used as an exemplar of any graphics controller; and host-to-PCI bridge 140 and PCI-to-ISA bridge 170 are used as exemplars of any type of bridge. Consequently, as used herein the specific exemplars set forth in FIG. 1 are intended to be representative of their more general classes. In general, use of any specific exemplar herein is also intended to be representative of its class, and the non-inclusion of such specific devices in the foregoing list should not be taken as indicating that limitation is desired FIG. 2 shows an exemplary speaker system 145 embodying the present disclosure. The speaker system 145 includes at least one speaker that includes at least one transducer. FIG. 2 shows a speaker system including a left speaker 220 and a right speaker 240. The speaker system may also include additional speakers, such as a center speaker 210 or rear speakers (not shown) present in many known home theater sound systems. The speaker system 145 may also include at least one subwoofer 230. Each speaker 210, 220, 230, 240 includes at least one transducer 211, 221, 231, 241, respectively, and may also include at least one amplifier (not shown).

The speaker system 145 also includes a control circuit 200 embodying the diagnostics circuit 295 of the present disclosure. While the control circuit 200 is depicted in FIG. 2 as a discrete element of the speaker system 145, it may physically reside in the subwoofer 230 (if present) or in another speaker of the speaker system 145. Alternatively, each speaker of the speaker system 145 could include a separate dedicated control circuit 200. FIG. 2 shows that the control circuit 200 sends a rectified power signal 285 to at least one speaker and at least one diagnostic signal 280, 282 to each speaker 210, 220, 230, 240 in the speaker system 145. The control circuit 200 also sends one or more status indicators 206 to each analog test indicator 260*a*–260*n*. The analog test indicators 260*a*–260*n* are discussed below in connection with FIG. 3.

FIG. 2 shows that the diagnostics circuit 295 includes two test circuits: power diagnostics 270 and analog diagnostics 275. The power diagnostics 270 are further shown in FIG. 4 and are discussed below. Regarding the analog diagnostics 275, FIG. 3 is a block diagram of the circuit 275, that performs analog diagnostic testing within an audio speaker system 145.

Figure 3:
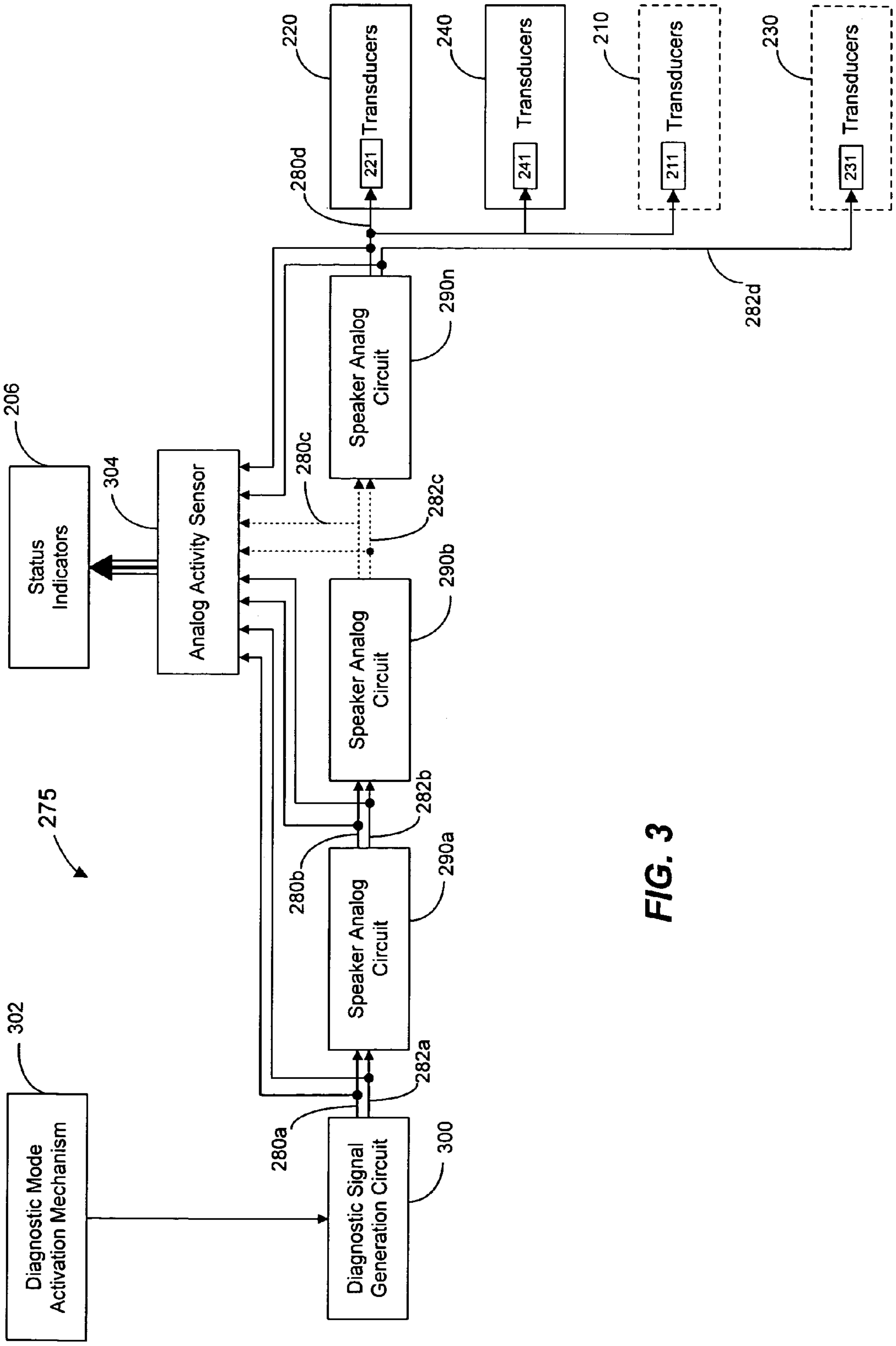
FIG. 3 is a block diagram of a circuit that performs analog diagnostics within an audio speaker system.

FIG. 3 shows that the analog diagnostics 275 are invoked when the diagnostic mode activation mechanism 302 signals that the diagnostic mode has been selected by the operator. The physical implementation of the mechanism 302 may be any conventional implementation known in the art and varies according to design concerns and the physical characteristics of the speaker system 145. For instance, the mechanism 302 may be implemented as an additional hardware switch or button. In other speaker systems, the indicator 302 may implemented using an existing mode button.

When the diagnostic mode activation mechanism 302 is activated, the diagnostic signal generation circuit 300 generates one or more test signal(s) 280, 282. The test signal(s) 280, 282 generated by the signal generation circuit 300 have a two-fold purpose: analog circuitry diagnosis as well as speaker transducer diagnosis. Regarding the latter, the test frequencies generated by the signal generation circuit 300 must be in the audible range so that the operator can determine whether sound is emanating from the transducer during the diagnostic session. The signal generation circuit 300 must therefore generate sufficient test signals 480, 482 to exercise all of the transducers in the speaker system 145 at the appropriate frequency. For example, if the speaker system 145 consists of only a stereo pair of full-range satellite speakers 220 and 240, a single mid-range test frequency 280 injected into both speakers 220, 240 will adequately diagnose the speaker system. If, however, the speaker system further consists of a subwoofer 230 such as that shown in FIG. 2, a second signal frequency 482 is required to exercise the subwoofer 530.

The physical implementation of the signal generation circuit 300 shown in FIG. 3 varies according to speaker system architectures. For instance, in a speaker system that incorporates a microprocessor, the preferred physical implementation of the signal generation circuit 300 uses the microprocessor to generate the test frequencies 280, 282 necessary for speaker system diagnosis. In contrast, in a pure analog architecture the signal generation circuit 300 is a separate hardware element. In such case, the preferred signal generation circuit 300 exhibits low cost and high reliability. Two examples of such signal generation circuits are 1) low-cost crystal oscillator circuits, and 2) semiconductor timing circuits such as the 555 timer.

FIG. 3 shows that the test signals 280, 282 generated by the signal generation circuit 300 are routed to one or more speaker analog circuits 290*a*–290*n* and to one or more transducers 221, 211, 241, 231 of the speaker system. The test signals 280, 282 are also routed to the analog activity sensor 304. The analog activity sensor 304 must sample activity at all critical junctions in the speaker system circuit. Where these critical junctions lie depends on the architecture of the speaker subsystem.

Regarding the speaker analog circuits 290*a*–290*n* shown in FIG. 3, the present disclosure may be implemented in any configuration of speaker system. Various speaker designs include differing speaker analog circuits 290*a*–290*n* because each has different stages of attenuation, power, equalization, etc. Typical examples of speaker analog circuits 290*a*–290*n* include input attenuation, tone processing, master volume control, and equalization. Depending on the configuration of the speaker subsystem, a particular test signal 280, 282 may not be routed to every speaker analog circuit 290*a*–290*n*. The speaker analog circuits 290*a*–290*n* and transducer(s) through which a test signal is designed to flow is referred to as the test signal's test path.

FIG. 3 shows that the test signals 280, 282 are sampled before and after transmission to each speaker analog circuit 290*a*–290*n* in their test path. This sampling is performed by routing the test signals 280*a*–280*d* and 282*a*–282*d* to the analog activity sensor 304. FIG. 3 illustrates the preferred embodiment, where the test signals 280, 282 are sampled by the analog activity sensor 304 both before and after being routed to each speaker analog circuit 290*a*–290*n* in their test path. In alternative embodiments, the test signals 280, 282 are routed to the analog activity sensor 304 only after being routed to each speaker analog circuit 290*a*–290*n* in their test path.

The analog activity sensor 304 shown in FIG. 3 receives the sampled signals 280*a*–280*d*, 282*a*–282*d* and generates a separate status indicator 206*a*–206*n* for each speaker analog circuit 290*a*–290*n*, respectively. In an alternative embodiment, the analog activity sensor and status indicators 206*a*–206*n* are not present. This latter embodiment capitalizes on the fact that the test signal 280, 282 must pass through each speaker analog circuit 290*a*–290*n* in the test path before reaching the transducer. If one or more of the speaker analog circuits 290*a*–290*n* is not operating, the test signal will not reach the transducer, and no sound will emanate from the transducer. This embodiment thus produces a large-scale indication of subsystem operability, which is particularly useful in speaker subsystems that contain a microprocessor to regulate controls. In contrast, the preferred embodiment uses the analog activity sensor 304 and status indicators 206*a*–206*n* to generate a more detailed indication of operability for individual speaker analog circuits 290*a*–290*n*. An intermediate indication of operability can be generated in an alternative embodiment by routing more than one status indicator 206*a*–206*n* to a single analog test indicator 260*a*–260*n* (FIG. 2).

In the preferred embodiment, analog activity sensor 304 "senses" each sampled signal 480*a*–480*d*, 482*a*–482*d* with a separate transistor (not shown) that acts as a switch. As the active signal oscillates, the transistors switch DC voltage, each creating a Pulse Width Modulated (PWM) signal. The PWM signals are presented as inputs to the respective analog test indicator 260*a*–260*n* (FIG. 2) as its input, resulting in the analog test indicator 260*a*–260*n* indicating when there is activity on the speaker analog circuit 290*a*–290*n* under test. In an alternative embodiment, the function of the analog activity sensor 304 can also be accomplished with comparators providing the PWM input into the analog test indicator 260*a*–260*n*. In either embodiment, the preferred analog test indicator 260*a*–260*n* includes an LED circuit or LED array circuit. With the alternative comparator architecture, the LED drive must be generated external to the comparator circuit. One skilled in the art will recognize that the LED may be alternatively replaced with any indicator device, such as a simple light bulb, or a readout on a liquid crystal display or other alphanumeric display mechanism.

Alternatively, for a speaker system that includes an internal microprocessor, the resulting PWM signals from each of the speaker analog circuits 290*a*–290*n* under test are presented to the microprocessor 110 (FIG. 1) for interpretation and display. Rather than an LED, the status indicators 206 may be displayed to the operator through any display mechanism available to the speaker system 145 such as a computer display monitor, LED circuit, LED array circuit, or LCD.

Figure 4:
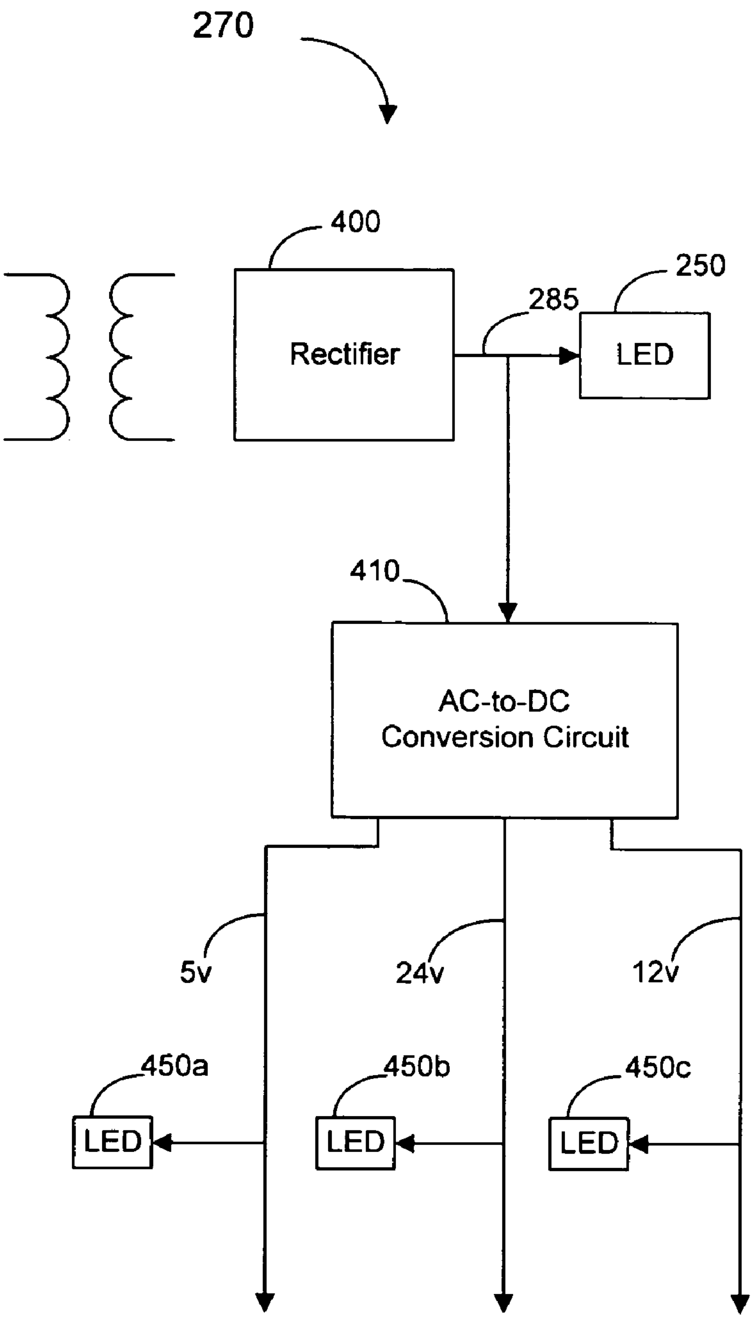
FIG. 4 is a block diagram of a circuit that performs power diagnostics within an audio speaker system.

FIG. 4 shows the power diagnostics 270 of the present disclosure. As is shown in FIG. 2, the diagnostics circuit 295 of the present disclosure achieves full analog diagnostic capability for the speaker system by providing power diagnostics 270 in addition to the analog diagnostics 275 described above. FIG. 4 shows that the power diagnostics 270 are integral to the power circuit for speaker system 145, which is a circuit well known in the art. The AC power from the power input is sent through a rectifier 400 that rectifies the AC signal into a rectified signal 285. FIG. 4 shows that the rectified signal 285 is then sent to an AC power test indicator 250, which indicates to the user or technician whether AC power is being sufficiently supplied to the speaker system 145, and to an AC-to-DC conversion circuit 410 that generates multiple DC voltages 5V, 12V, 24V. While FIG. 4 shows that the AC-to-DC conversion circuit 410 generates three DC voltages constituting five (5), twelve (12) and twenty-four (24) volts, the AC-to-DC conversion circuit 410 may generate any number of signals having any voltage value known in the art. These DC voltages 5V, 12V, 24V are each routed to a separate DC power test indicator 450*a*, 450*b*, 450*c*, respectively. In this manner the power diagnostics 270 further test power at the output of the AC-to-DC conversion circuit 410 of the power supply design. This provides the analog diagnostic information concerning whether or not DC power is being sufficiently supplied to the circuits on the PCB. The AC power test indicator 250 and DC power test indicators 450*a*, 450*b*, 450*c* are LED circuits in the referred embodiment.

Those skilled in the art will recognize that, based upon the teachings herein, several modifications may be made to the embodiments described above. For example, all power test indicators 250*a*–250*d* could be placed in one central location rather than being placed on individual speakers. Similarly, the LED circuits comprising the analog test indicators 260*a*–260*n* and the AC-to-DC test indicators 450*a*–450*c* could also be placed in the central location. Each of the indicators 250*a*–250*d*, 260*a*–260*n*, 450*a*–450*c* may be, instead of an LED, any indicator device, such as a simple light bulb, a liquid crystal display, or any alphanumeric display mechanism.

While particular embodiments of the present disclosure have been shown and described, it will be recognized to those skilled in the art that, based upon the teachings herein, further changes and modifications may be made without departing from this disclosure and its broader aspects, and thus, the appended claims are to encompass within their scope all such changes and modifications as are within the true spirit of the scope of this disclosure.

What is claimed is:

1. A speaker system, comprising:

at least one transducer;

at least one speaker analog circuit;

a diagnostics circuit including a first test circuit and a second test circuit;

the first test circuit being for analog diagnostics actuated in response to a diagnostic mode selection being made for generating one or more test signals for analog circuitry diagnosis and speaker diagnosis; and the second test circuit generating a signal to an AC power test indicator for indicating sufficient AC power being supplied to the speaker system and to an AC-to-DC conversion circuit for generating multiple DC voltages for providing analog diagnostic information indicating a sufficient supply of DC power for circuits in the speaker system.

2. The speaker system recited in claim 1, wherein the diagnostics circuit further comprises a power diagnostics circuit.

3. The speaker system recited in claim 2, wherein the power diagnostics circuit further comprises:

a rectifier; and at least one AC power test indicator coupled to the rectifier.

4. The speaker system recited in claim 1, further comprising:

an analog diagnostics circuit including a diagnostic mode activation mechanism.

5. A speaker system recited in claim 4, wherein the analog diagnostics circuit includes a diagnostic signal generation circuit and each at least one transducer is coupled to the diagnostic signal generation circuit.

6. The speaker system recited in claim 1, further comprising:

an analog activity sensor comprising at least one transistor.

7. A speaker system recited in claim 1, further comprising:

an analog activity sensor comprising at least one comparator.

8. A computer system comprising:

a processor;

a memory coupled to the processor;

a speaker system coupled to the processor, wherein the speaker system includes a diagnostics circuit including a first test circuit and a second test circuit;

the first test circuit being for analog diagnostics actuated in response to a diagnostic mode selection being made for generating one or more test signals for analog circuitry diagnosis and speaker diagnosis;

the second test circuit generating a signal to an AC power test indicator for indicating sufficient AC power being supplied to the speaker system and to an AC-to-DC conversion circuit for generating multiple DC voltages for providing analog diagnostic information indicating a sufficient supply of DC power for circuits in the speaker system; and at least one transducer.

9. The computer system recited in claim 8, wherein the diagnostics circuit further comprises a power diagnostics circuit.

10. The computer system recited in claim 9, wherein the power diagnostics circuit further comprises:

a rectifier; and at least one AC power test indicator coupled to the rectifier.

11. The computer system recited in claim 8, further comprising:

an analog diagnostics circuit including a diagnostic mode activation mechanism.

12. The computer system recited in claim 11, wherein the analog diagnostics circuit includes a diagnostic signal generation circuit and each at least one transducer is coupled to the diagnostic signal generation circuit.

13. The computer system recited in claim 8, further comprising:

an analog activity sensor comprising at least one transistor.

14. The computer system recited in claim 8, further comprising:

an analog activity sensor comprising at least one comparator.

* * * * *

UNITED STATES PATENT AND TRADEMARK OFFICE

CERTIFICATE OF CORRECTION

PATENT NO. : 7,006,637 B1 
APPLICATION NO. : 09/360060
DATED : February 28, 2006
INVENTOR(S) : Konetski et al.

It is certified that error appears in the above-identified patent and that said Letters Patent is hereby corrected as shown below:

Claim 5, Column 8, line 13, delete “A” and insert -- The--.

Claim 7, Column 8, line 21, delete “A” and insert -- The--.

Signed and Sealed this

Eighth Day of May, 2007

JON W. DUDAS
*Director of the United States Patent and Trademark Office*